United States Patent [19]

Ino

[11] Patent Number: 5,075,745
[45] Date of Patent: * Dec. 24, 1991

[54] CAPACITOR CELL FOR USE IN A SEMICONDUCTOR MEMORY INTEGRATED CIRCUIT DEVICE

[75] Inventor: Masayoshi Ino, Tokyo, Japan

[73] Assignee: Oki Electric Industry Co., Ltd., Tokyo, Japan

[*] Notice: The portion of the term of this patent subsequent to Feb. 6, 2007 has been disclaimed.

[21] Appl. No.: 551,579

[22] Filed: Jul. 2, 1990

Related U.S. Application Data

[62] Division of Ser. No. 428,045, Oct. 27, 1989, which is a division of Ser. No. 280,155, Dec. 5, 1988, Pat. No. 4,899,203.

[30] Foreign Application Priority Data

Dec. 11, 1987 [JP] Japan ................. 62-312014

[51] Int. Cl.$^5$ ............ H01L 29/68; H01L 27/12; H01L 27/02; H01L 29/06
[52] U.S. Cl. ........................... 357/23.6; 357/49; 357/51; 357/55
[58] Field of Search .............. 357/23.6, 51, 55

[56] References Cited

U.S. PATENT DOCUMENTS 4,845,539  7/1989  Inoue ................... 357/23.6
4,899,203  2/1990  Ino ....................... 357/51

FOREIGN PATENT DOCUMENTS 59-141262  8/1984  Japan .................. 357/23.6
55-21102  10/1985  Japan .................. 357/23.6
62-193168  8/1987  Japan .................. 357/23.6

OTHER PUBLICATIONS

Author unknown, "Improved Signal and Density Dynamic Random-Access Memory", IBM Technical Disclosure Bulletin, vol. 31, No. 3, Aug. 1988, pp. 279-286.

Primary Examiner—Andrew J. James
Assistant Examiner—Cynthia S. Deal
Attorney, Agent, or Firm—Wenderoth, Lind & Ponack

[57] ABSTRACT

In a semiconductor memory integrated circuit device having a stacked capacitor cell, a first plate electrode and a first dielectric film are formed underneath a charge storage electrode, and a second dielectric film and a second plate electrode are formed over the charge storage electrode. The charge storage electrode makes contact with the diffusion region through a contact hole penetrating the first dielectric material. The first and second plate electrodes are connected via a contact hole penetrating the first and second electric films outside the cell area. Since both the upper surface and the lower surface of the charge storage electrode are utilized for the formation of the capacitor, the size of the capacitor can be halved to produce the same capacitance.

11 Claims, 6 Drawing Sheets

FIG. I(a) PRIOR ART
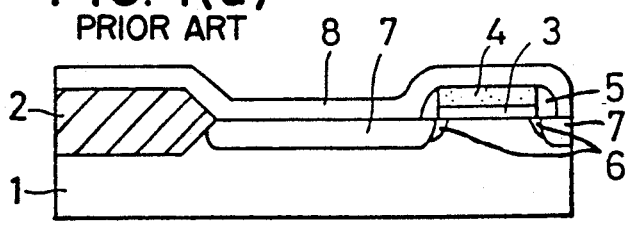
FIG. I(a') PRIOR ART
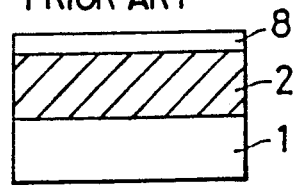
FIG. I(b) PRIOR ART
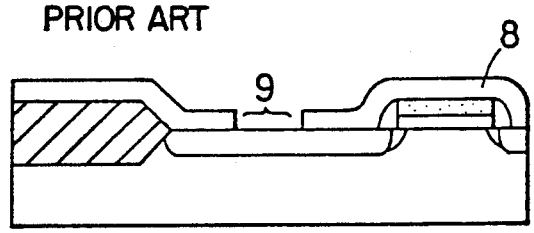
FIG. I(c) PRIOR ART
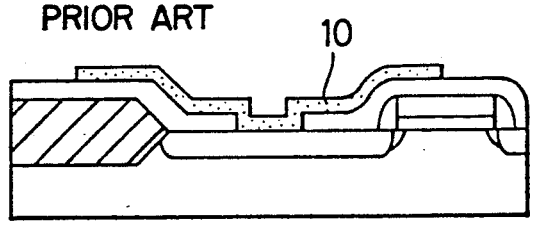
FIG. I(d) PRIOR ART
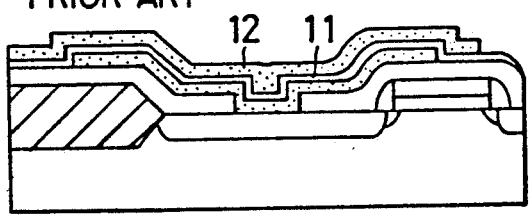
FIG. I(d') PRIOR ART
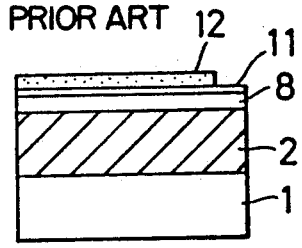
FIG. I(e) PRIOR ART
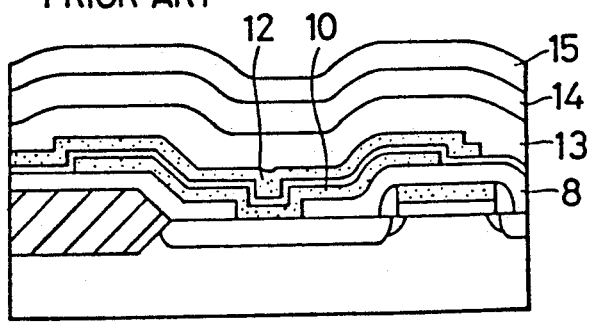
FIG. I(e') PRIOR ART
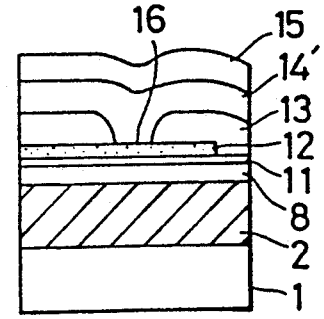

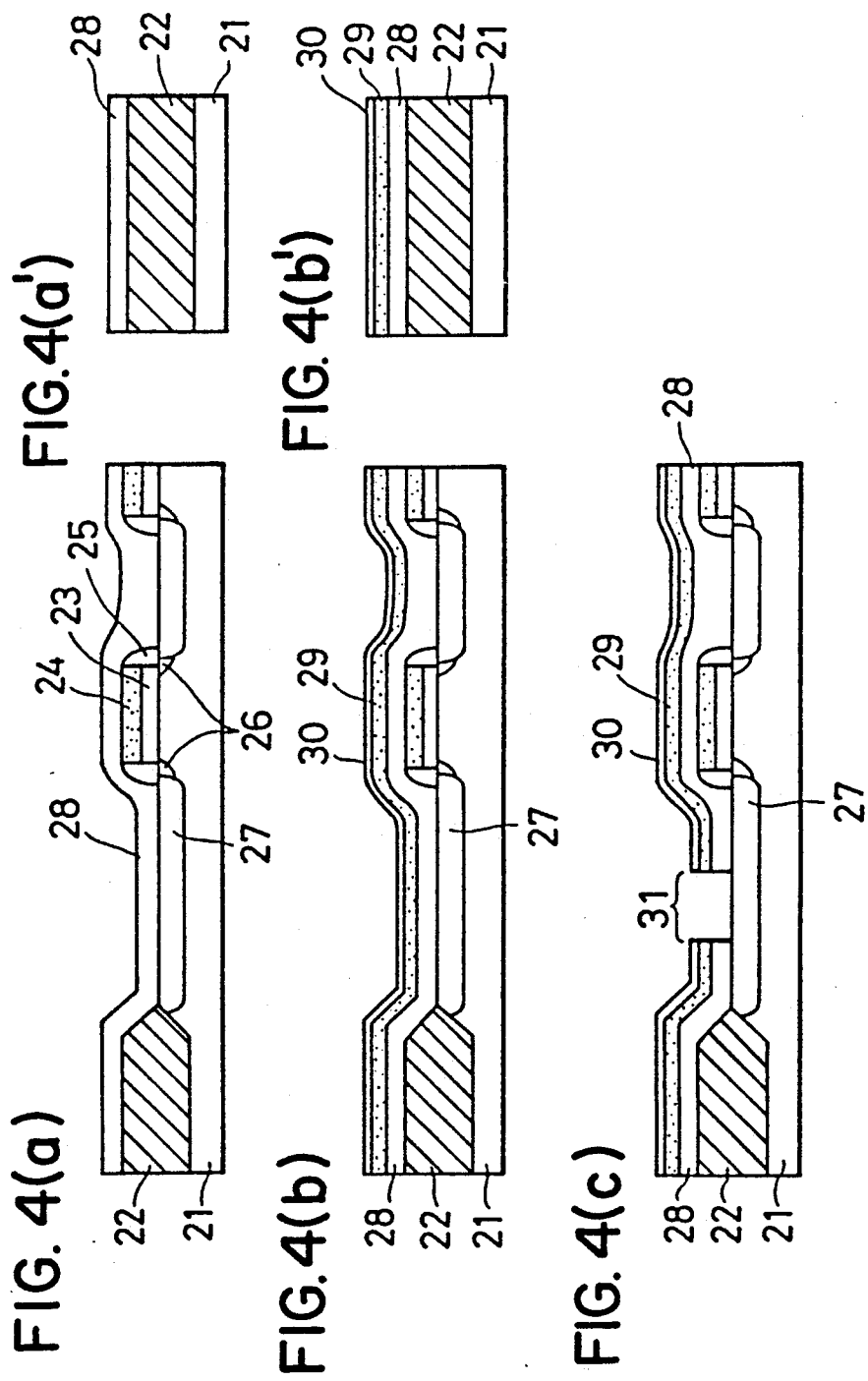

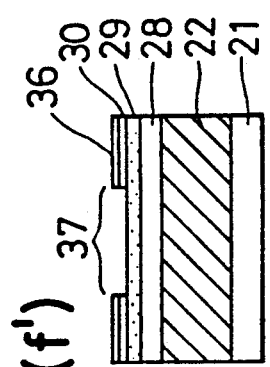
FIG. 4(f')
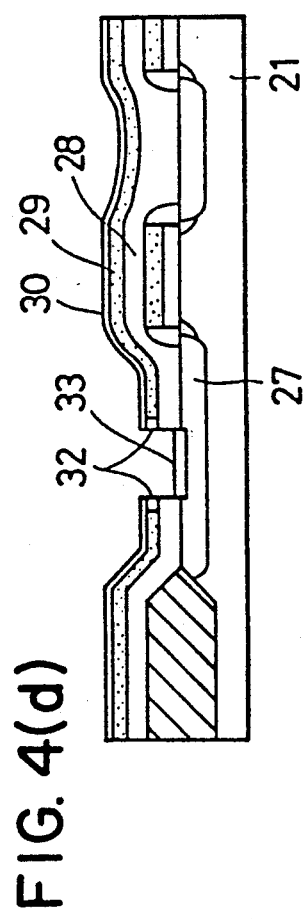
FIG. 4(d)
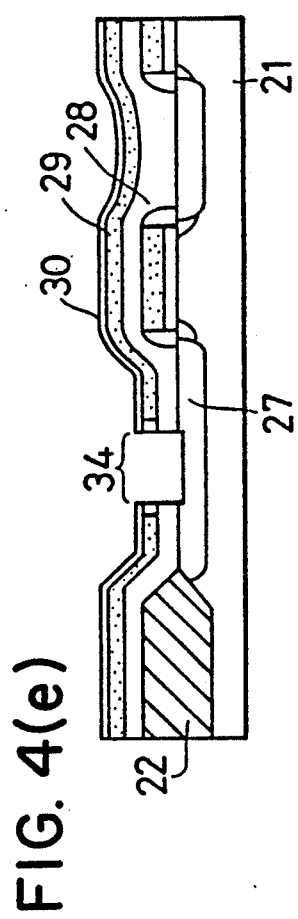
FIG. 4(e)
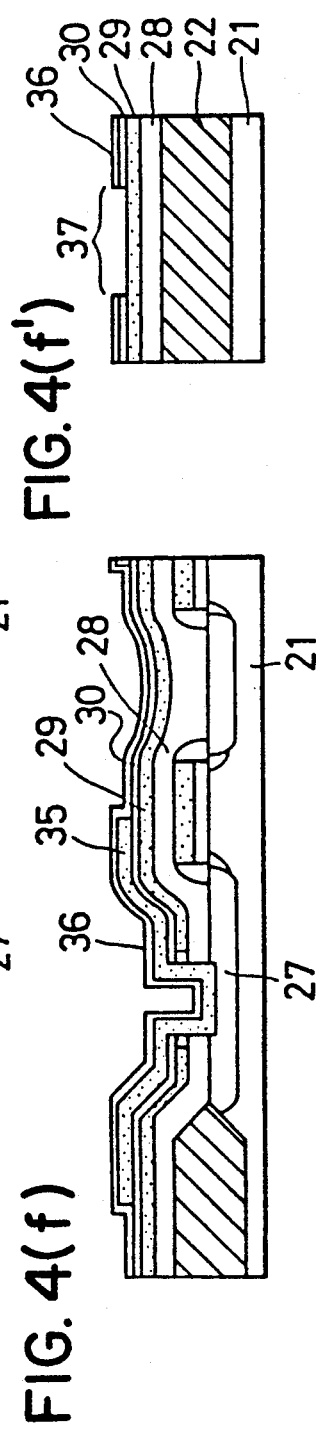
FIG. 4(f)

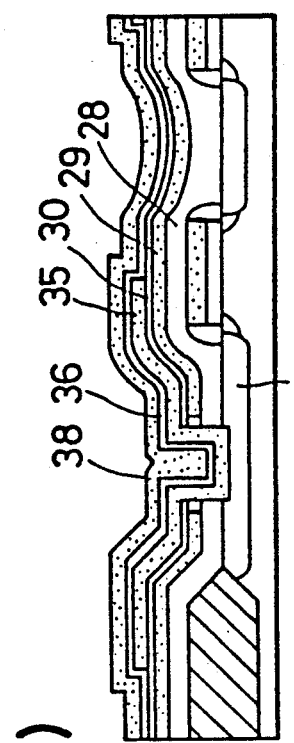
FIG. 4(g)
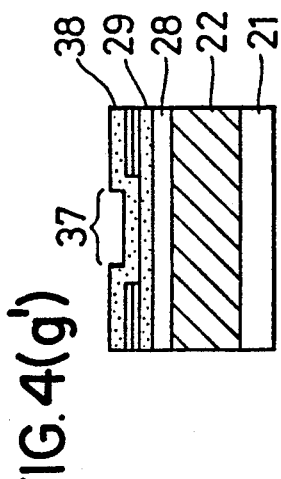
FIG. 4(g')
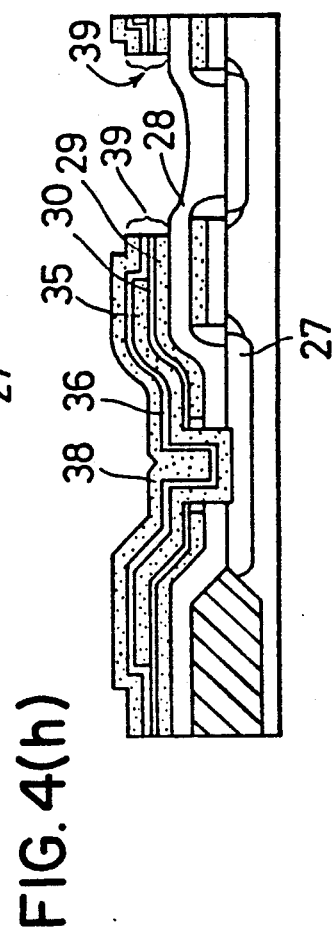
FIG. 4(h)
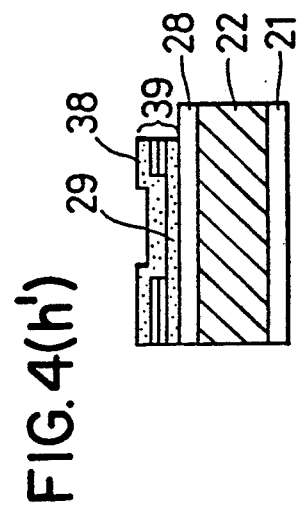
FIG. 4(h')

CAPACITOR CELL FOR USE IN A SEMICONDUCTOR MEMORY INTEGRATED CIRCUIT DEVICE

This application is a divisional of allowed application Ser. No. 07/428,045, filed on Oct. 27, 1989, which is in turn a divisional of application Ser. No. 07/280,155, filed on Dec. 5, 1988, now U.S. Pat. No. 4,899,203.

BACKGROUND OF THE INVENTION

The present invention relates to a MOS semiconductor dynamic random access memory employing stacked capacitor cells and a process of fabricating the same.

The state of the art to which the invention relates is exemplified in an Annex No. 1 of Nikkei Micro Device "Jitsuyouka ni Mukete Shidousuru 4MDRAM no Zenbou (The Entire Picture of 4Mbit DRAM Starting for Commercialization)" pp. 117 to 130, and pp. 165 to 174, (May 1987).

FIG. 1 shows an example of a fabrication process of such a conventional dynamic random access memory device (semiconductor memory integrated circuit device) employing stacked capacitor cells. The memory device is made up of a memory cell area in which a plurality of memory cells are arranged in rows and columns to form one or more matrices, and a peripheral area outside of the memory cell area. In FIG. 1, a portion of the cell area containing a single memory cell is shown at (a) to (e) and a portion of the peripheral area is shown at (a'), (d') and (e').

Formed on a substrate 1 are an isolation field oxide film 2, a gate insulation film 3, a gate electrode 4, sidewall insulating films 5, a transistor device including impurity diffusion regions 6 of a relatively low concentration ($10^{17}$ to $10^{19}$/cm$^3$) and having a conductivity type opposite to that of the substrate 1, and an impurity diffusion regions 7 (hereinafter referred to as a high-concentration diffusion region) of a relatively high concentration and having the same conductivity type as the impurity diffusion region 6, and an insulating film 8 covering the entire surface. The resultant structure is shown at (a) and (a') in FIG. 1. During the above-described steps, known oxidation and diffusion processes can be utilized. The gate electrode 4 also serves as a word line and one of the high concentration diffusion regions 7 also serves as a data storage capacitor.

Next, a contact hole 9 for connection of the lower electrode of the stacked capacitor to one of the high concentration diffusion regions 7 is formed by photolithography (exposure, development and etching). The resultant structure is shown at (b) in FIG. 1. The peripheral area is unchanged.

Then, a lower electrode 10 which will become the charge storage part of the stacked capacitor is formed by known photolithography. The resultant structure is shown at (c) in FIG. 1. The lower electrode 10 can be formed of a polysilicon of the same conductivity type as the high-concentration diffusion region 7. The peripheral area is again unchanged.

Subsequently, a dielectric material film 11 is deposited over the entire surface of the structure shown at (c) and (a') in FIG. 1, and an upper electrode 12 of the stacked capacitor is formed over the dielectric material film 11 into a desired pattern by means of known photolithography. The resultant structure is shown at (d) and (d') in FIG. 1. The upper electrode 12 is typically formed of a polysilicon which is of the same type as that of the lower electrode 10.

Although the dielectric material film 11 is shown covering the entire surface, portions thereof may be removed other than that which is underneath the upper electrode 12.

Finally, an inter-layer insulating layer 13, a metal wiring conductor 14 and a passivation insulating film 15 are formed. A contact hole 16 for connection of a wiring metal conductor 14' for providing a predetermined voltage to the capacitor upper electrode 12 are formed, at the same time as the formation of the contact hole for connection with the metal conductor 14. The resultant structure is shown at (e) and (e') in FIG. 1.

With the above-described structure, the surface area of the electrodes 10 and 12 which extend along the principal plane of the substrate 1 places a limit on the reduction of the memory cell size and hence a limit on the increase in the degree of integration (packing density).

SUMMARY OF THE INVENTION

An object of the invention is to enable a reduction in memory cell size.

Another object of the invention is to provide a semiconductor memory integrated circuit device having a higher degree of integration.

Another object of the invention is to provide a process for fabrication of a semiconductor memory integrated circuit device having smaller memory cells and hence a higher degree of integration.

A semiconductor memory integrated circuit device according to the invention comprises:
(a) a semiconductor substrate (21);
(b) a first diffusion region (17), a channel region and a second diffusion region (27) formed in the substrate;
(c) a gate insulating film (23) and a gate electrode (24) formed over the channel region;
(d) a first insulating film (28) formed over said second diffusion region;
(e) a first plate electrode (29) formed over said first insulating film;
(f) a second insulating film (30) formed over said first plate electrode;
(g) a charge storage electrode (35) formed over said second insulating film and having a part (35a) extending through a first contact hole (31) provided through said first insulating film, said first plate electrode and said second insulating film to contact said second diffusion region;
(h) a third insulating film (36) formed over said charge storage electrode; and
(i) a second plate electrode (38) formed over said third insulating film and having a part (38a) extending through a second contact hole provided through said second insulating film and said third insulating film to contact said first plate electrode.

In the above-described structure, the first plate electrode is provided in confrontation with the lower surface of the charge storage electrode across the second insulating film to form a capacitor. The charge storage electrode has a part extending through the first contact hole to contact the exposed part of the diffusion region. The fourth insulating film formed over the part of the first plate electrode exposed inside the first contact hole isolates the first plate electrode from the above-mentioned part of the charge storage electrode extending through the first contact hole. The second plate electrode are formed over the charge storage electrode, with the third insulating film interposed therebetween. The second plate electrode has a part extending through the second contact hole penetrating the second and third insulating films to contact the first plate electrode. A predetermined plate voltage is applied to the plate electrode which extend from the peripheral area. As a result, the entire surface, including the lower surface, of the charge storage electrode can be utilized for formation of a capacitor. Accordingly, the capacitance derived is about twice that of the conventional device. Stated inversely, the the area for the formation of the capacitor can be halved if other conditions are identical.

A process of fabrication of a semiconductor memory integrated circuit device according to the invention comprises the steps of:

(a) forming an isolation region (29), a gate insulating film (23), a gate electrode (24), a first diffusion region (17) and a second diffusion region (27) and a first insulating film (28) on a substrate (21);

(b) forming a first plate electrode (29) on said first insulating film (28) over said second diffusion region;

(c) forming a second insulating film (30) over said first plate electrode;

(d) forming a first contact hole (31) through said first insulating film, said first plate electrode and said second insulating film to expose said second diffusion region;

(e) forming a charge storage electrode (35) over said second insulating film (30) with a part extending through said first contact hole to contact the exposed part of said diffusion region;

(f) forming a third insulating film (36) over said charge storage electrode;

(g) forming a second contact hole (37) through said second and third insulating films to expose part of said first plate electrode; and (h) forming a second plate electrode (38) over said third insulating film with a part extending through said second contact hole to contact the exposed part of said first plate electrode.

BRIEF DESCRIPTION OF THE DRAWINGS

FIG. 1(a-e) is a diagram showing the steps of fabrication of a prior-art semiconductor memory integrated circuit device.

FIG. 4(a-b) is a diagram showing the steps of fabrication of the semiconductor memory integrated circuit device shown in FIG. 2.

DETAILED DESCRIPTION OF THE PREFERRED EMBODIMENTS

Embodiments of the present invention will now be described with reference to FIG. 2, FIG. 3 and FIG. 4.

Figure 2B:
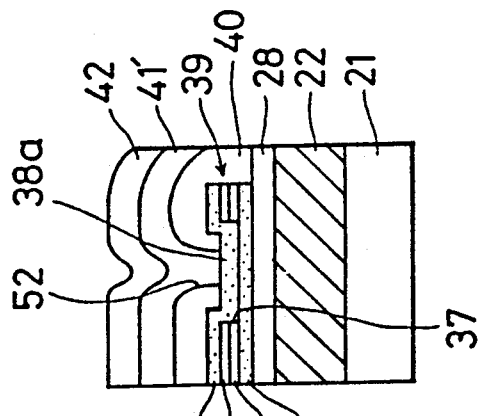
FIG. 2(a-b) is a diagram showing the structure of an embodiment of a semiconductor memory integrated circuit device according to the present invention.
Figure 2A:
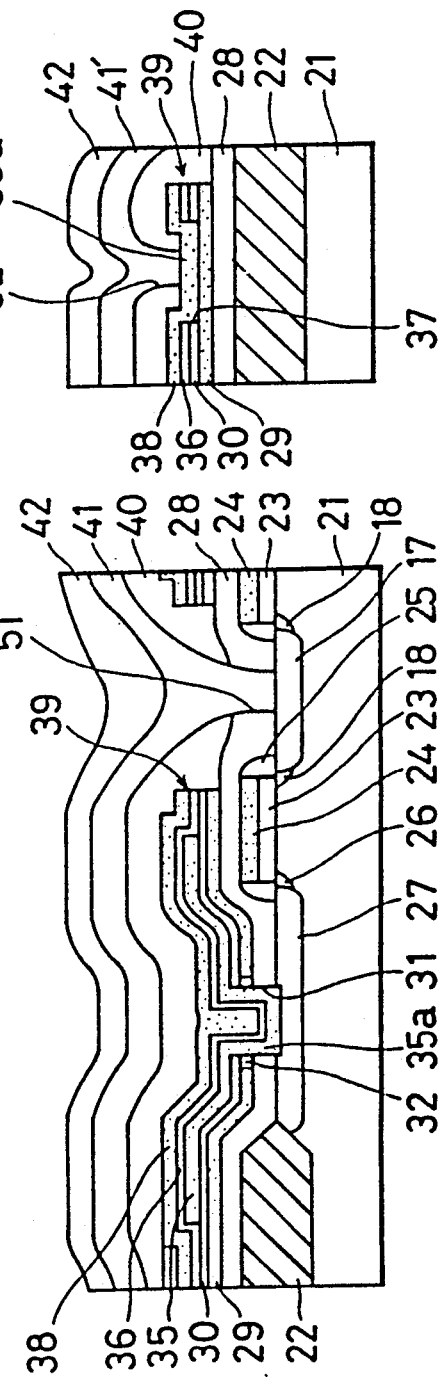
Figure 3:
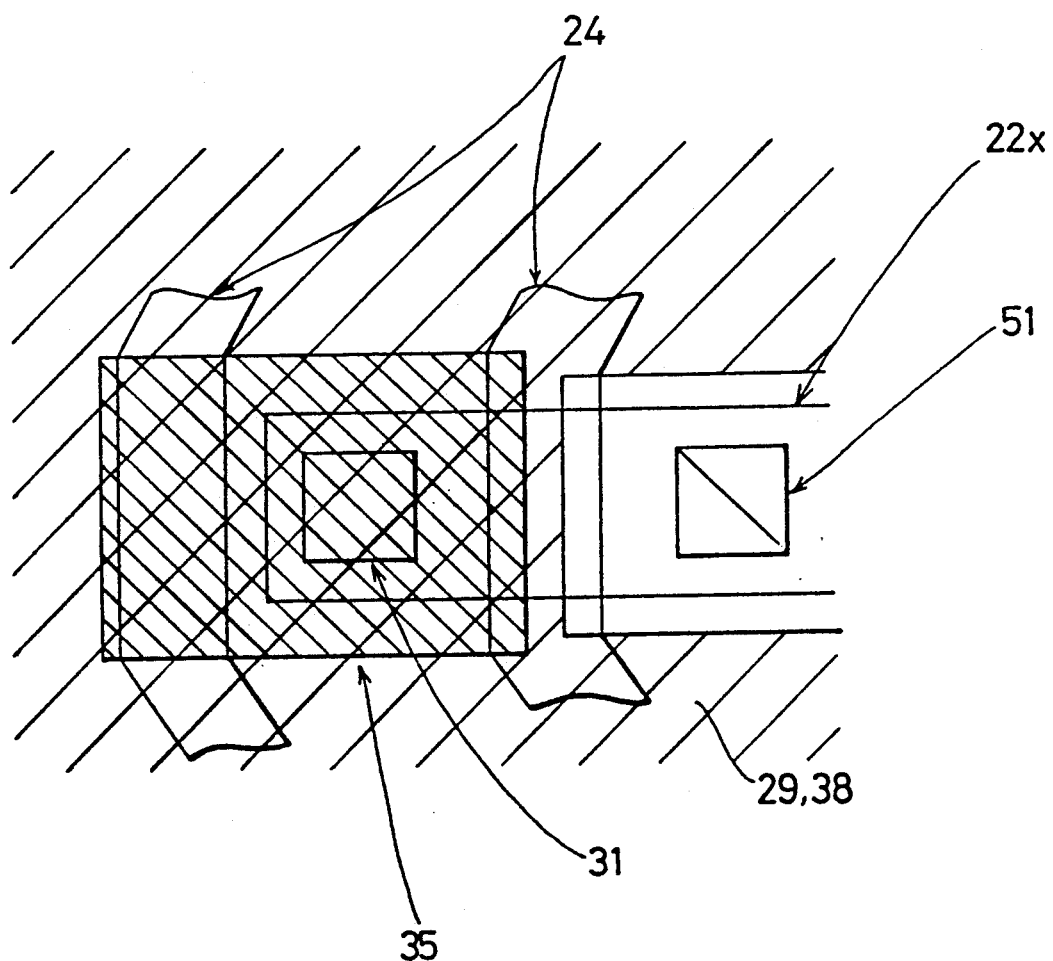
FIG. 3 is a plan view showing disposition of the first and second plate electrodes, the charge storage electrode, and the contact of the charge storage electrode with respect to the active region of the memory cell.

FIG. 2 shows part of a cell area and part of a peripheral area, at (a) and (b), respectively, in elevational section.

As illustrated, the device includes a semiconductor substrate, such as p-type silicon substrate 21, an isolation field oxide film 22 (outside of the line 22x in FIG. 3), a gate insulating film 23, a gate electrode 24, and a sidewall insulating film 25. Part of the substrate 21 directly underneath the gate electrode 24 constitutes a channel unnumbered. Impurity regions 17 and 27 (which will hereinafter be referred to as high concentration diffusion regions) are provided adjacent the opposite ends of the channel. The impurity diffusion regions 17 and 27 have a relatively high concentration of impurities which are of the n-type, i.e., which are a conductivity type opposite to that of the substrate 21. Impurity diffusion regions 18 and 26 are formed in the substrate 21 between the opposite ends of the channel and the impurity diffusion regions 17 and 27. The impurity diffusion regions 18 and 26 have a relatively low concentration of n-type impurities, i.e., the same conductivity type as that of the impurity diffusion regions 17 and 27.

An insulating film 28 is formed over the substrate 21 and the gate electrode 24. A first plate electrode 29 formed of polysilicon of the same conductivity type as the high concentration diffusion regions 17 and 27 is formed over the insulating film 28. A first capacitor dielectric material film 30, of nitride film or the like, having an anti-oxidation property is formed over the first plate electrode 29. A charge storage electrode 35 of the stacked capacitor is formed over the first plate electrode 29. A second capacitor dielectric material film 36 is formed over the charge storage electrode 35. The second capacitor dielectric material film 36 can be formed of the same material as the first dielectric material film 30. A second plate electrode 38 is formed over the second capacitor dielectric material film 36. The first and second capacitor plate electrodes 29 and 38 and the first and second capacitor dielectric material films 30 and 36 are patterned to have the same contours 39. An inter-layer insulating film 40, a metal wiring conductor 41 and a passivation insulating film 42 are also provided. The metal wiring conductor 41 constitutes a bit line of the memory and is connected to the diffusion region 17 through a contact hole 51 penetrating the insulating film 28 and the inter-layer insulating film 40.

The charge storage electrode 35 has a part 35a extending through a contact hole 31 to contact the diffusion region 27. The contact hole 31 penetrates the insulating film 28, the first plate electrode 29 and the first dielectric material film 30. The part of the first plate electrode 29 defining the contact hole 31 is covered with an insulating film 32 formed by oxidation.

Another contact hole 37 is provided to penetrate the first and second dielectric material films 30 and 36 at the peripheral area outside of the memory cell arrays, and over the isolation field oxide film 22. The second plate electrode 38 has a part 38a extending through the contact hole 37 to contact the first plate electrode 29. Also in the peripheral area, a plate voltage applying metal conductor 41' is connected to the second plate electrode 38 through a contact hole 52 penetrating the inter-layer insulating film 40, as shown at (b) in FIG. 2.

FIG. 4 shows an example of the fabricating process of the semiconductor memory integrated circuit device described above. The fabrication of the cell area is shown at (a) through (h), while the fabrication of the peripheral area is shown at (a'), (b'), and (f') through (h'). The reference numerals identical to those in FIG. 2 denote identical or similar parts, regions, films and layers. During the steps shown at (c) through (e) with regard to the cell area, the peripheral area is unchanged (from the state shown at (b') so that corresponding figures are omitted.

First, in the same manner as step (a) in FIG. 1, known oxidation and diffusion techniques are used to form isolation field oxide film 22, the gate insulating film 23, the gate electrode 24, the sidewall insulating film 25, and a transistor device including the impurity diffusion regions 18 and 26 of a relatively low impurity concentration ($10^{17}$ to $10^{19}$/cm$^3$) having an opposite conductivity than the substrate 21 and the high concentration diffusion regions 17 and 27 of a relatively high impurity concentration having the same conductivity as the impurity diffusion region 18 and 26, and the insulating film 28 covering the entire surface. The resultant structure is shown in FIG. 4 at (a) and (a').

Then, a polysilicon film 29 which will become the first plate electrode is deposited unselectively, e.g., over the entire surface of the insulating film 28. The polysilicon film 29 is of the same conductivity type as the high impurity concentration layers 17 and 27. Then, the first capacitor dielectric material film 30, which may be a nitride film or the like, having an anti-oxidation property is deposited unselectively. The resultant structure is shown in FIG. 4 at (b) and (b').

Then, photolithography is used to form a contact hole 31 to expose part of the high impurity concentration region 27. An attendant effect is that part of the first plate electrode 29 is exposed inside the contact hole 31. The resultant structure is shown in FIG. 4 at (c) and (b').

The entire surface is subjected to an oxidizing atmosphere with a predetermined condition so that the exposed part of the first plate electrode 29 and the exposed part of the high concentration diffusion region 27 in the contact hole 31 are selectively oxidized to form partial oxide films 32 and 33. The resultant structure is shown at (d) in FIG. 4. Where, for instance, the oxidation is performed at a temperature of 800° to 950° C., the dielectric material film 30 is hardly oxidized, even if its thickness is in the order of 100 Å, while partial oxide films 32 and 33 are formed to a thickness of 100 to 1000 Å.

Then, an anisotropic dry etching (reactive ion etching) is performed to selectively etch the partial oxide film 33 alone. For instance, when an etching gas that mainly consists of one of $C_nF_{2n+2}/C_mH_{2m}$ (n and m are integers) is used, the ratio between the etching rates of the $SiO_2$ and SiN can be made sufficiently large. As an example, when $C_2F_6/C_2H_4$ is used, SiN is hardly etched, while $SiO_2$ alone can be etched at a high etching rate, up to 800 Å. Thus, the dielectric material film 30 is little affected by the etching. Moreover, because of the anisotropy, the partial oxide film 32 is retained while the partial oxide film 33 is removed. The resultant structure is shown in FIG. 4 at (e).

Then, process steps similar to those described with reference to FIG. 1 at (c) and (d) are used to form the charge storage electrode 35 and the second capacitor dielectric material film 36 to produce a structure as shown in FIG. 4 at (f). More specifically, a conductor film 35 which will become the charge storage electrode 35 is deposited unselectively and then patterned by photolithography. The conductor film 35 may be formed of polysilicon containing an impurity of the same conductivity type as the first plate electrode 29. The charge storage electrode 35 is patterned to have the desired dimension and configuration. When deposited, the conductor film 35 has a part 35a extending through the contact hole 31 to contact the exposed part of the diffusion region 27. Because the first plate electrode 29 is covered with the partial oxide 32, it is ensured that the charge storage electrode 35 is electrically isolated from the first plate electrode 29. The second capacitor dielectric material film 36 can be formed of the same material as the first dielectric material film 30.

In the peripheral area, after the formation of the charge storage electrode 35 and the deposition of the second capacitor dielectric material film 36 in the cell area as described above, a contact hole 37 is formed by photolithography to produce a structure as shown in FIG. 4 at (f').

Then, a conductor film 38 which will become the second plate electrode 38 is deposited over the entire surface to produce a structure as shown in FIG. 4 at (g). The conductor film 38 may be formed of polysilicon containing an impurity of the same conductivity type as the first conductor film 29. In the cell area, the conductor film 38 is deposited over the entire surface so that the conductor film 38 will have a part 38a extending through the contact hole 37 to contact the first conductor film 29. The result is shown in FIG. 4 at (g').

Then, the second plate electrode 38 is patterned by photolithography to have the desired contours. After that, the second capacitor dielectric film 36, the first capacitor dielectric material film 30 and the first plate electrode 29 are successively patterned by etching using the second plate electrode 38 as a mask. As a result, contours or edges of these layers are formed as shown at 39 in FIG. 4 at (h) and (h').

In the above embodiment, the charge storage electrode 35 and the second plate electrode 38 are formed of polysilicon which contains impurities of the same conductivity type as the first plate electrode 29. They may alternatively be formed of any other conductor material.

The second capacitor dielectric material film 36 can be formed of the same material as the first dielectric material film 30 or a different dielectric material.

Then, in the same manner as described with reference to FIG. 1, the inter-layer insulating layer 40, the contact holes 51 and 52, the metal wiring conductors 41 and 42, and the passivation insulating film 42 are formed to produce the final structure as shown in FIG. 2. The metal wiring conductor 41 is connected to the diffusion region 17 through the contact hole 51. The metal wiring conductor 41' is connected to the second plate electrode 38 through the contact hole 52.

The invention is not limited to the specific embodiments described in that various modifications are possible without departing from the scope of the invention.

As has been described, according to the present invention, the the lower surface as well as the upper surface of the charge storage electrode can be used for the formation of the capacitor. Accordingly, the capacitance of the capacitor having the same size as that of the conventional capacitor is twice that of the conventional capacitor. Stated inversely, to provide a capacitor of the same capacitance using the same dielectric material, the size of the capacitor can be halved. The cell size can therefore be reduced and the degree of integration can be increased.

What is claimed is:

1. A capacitor cell for use in a semiconductor memory integrated circuit device, comprising:
    (a) a semiconductor substrate;
    (b) a diffusion region formed in said substrate;

(c) a first insulating film formed on said diffusion region;

(d) a first plate electrode formed on said first insulating film;

(e) a second insulating film formed on said first plate electrode, said second insulating film including an anti-oxidation material film and a partial oxide film;

(f) a charge storage electrode formed on said second insulating film and having an extending part which extends so as to contact said diffusion region;

(g) a third insulating film formed on said charge storage electrode; and (h) a second plate electrode formed on said third insulating film and having a part extending through a contact region so as to contact said first plate electrode, said contact region being provided through said second insulating film and said third insulating film.

2. A capacitor cell according to claim 1, wherein said first and second plate electrodes each have a part positioned outside of a periphery of said charge storage electrode which confront each other, and wherein a location of said contact region is provided at said part positioned outside of said charge storage electrode of each of said first and second plate electrodes.

3. A capacitor cell according to claim 1, wherein said contact region is formed on an isolation oxide film.

4. A capacitor cell according to claim 1, wherein said semiconductor memory integrated circuit device comprises a cell area in which a plurality of capacitor cells are arranged in an array, and a peripheral area located outside of said cell area, and wherein said contact region is disposed in the peripheral area.

5. A capacitor cell according to claim 1, further comprising a fourth insulating film formed on a part of said first plate electrode to isolate said first plate electrode from said extending part of said charge storage electrode.

6. A semiconductor memory integrated circuit device comprising:

a semiconductor substrate;

a cell area having a a plurality of capacitor cells located therein; and a peripheral area located outside of said cell area;

each of said capacitor cells comprising;

(a) a diffusion region formed in said substrate;

(b) a first insulating film formed on said diffusion region;

(c) a first plate electrode formed on said first insulating film;

(d) a second insulating film formed on said first plate electrode, said second insulating film including an anti-oxidation material film and a partial oxide film;

(e) a charge storage electrode formed on said second insulating film and having an extending part which extends so as to contact said diffusion region;

(f) a third insulating film formed on said charge storage electrode; and (g) a second plate electrode formed on said third insulating film and having a part extending through a contact region so as to contact said first plate electrode, said contact region being provided through said second insulating film and said third insulating film;

wherein said second contact region is disposed in said peripheral area.

7. A device according to claim 6, wherein said contact region is formed on an isolation oxide film.

8. A device according to claim 6, further comprising a fourth insulating film formed on a part of said first plate electrode to isolate said first plate electrode from said extending part of said charge storage electrode.

9. A capacitor cell according to claim 1, wherein said anti-oxidation material film is a nitride film, and said partial oxide film is a selectively oxidized part of said first plate electrode.

10. A device according to claim 6, wherein said anti-oxidation material film is a nitride film, and said partial oxide film is a selectively oxidized part of said first plate electrode.

11. A capacitor cell for use in a semiconductor memory integrated circuit device, comprising:

(a) a semiconductor substrate;

(b) a diffusion region formed in said substrate;

(c) a first insulating film formed on said diffusion region;

(d) a first plate electrode formed on said first insulating film;

(e) a second insulating film formed on said first plate electrode, said second insulating film including an anti-oxidation material film and a partial oxide film;

(f) a charge storage electrode formed on said second insulating film and having an extending part which extends so as to contact said diffusion region through a contact hole;

(g) a third insulating film formed on said charge storage electrode; and (h) a second plate electrode formed on said third insulating film and having a part extending through a contact region so as to contact said first plate electrode, said contact region being provided through said second insulating film and said third insulating film;

wherein said partial oxide film of said second insulating film is disposed in said contact hole between said first plate electrode and said charge storage electrode.

* * * * *